US010180485B2

United States Patent
Matsiev (10) Patent No.: US 10,180,485 B2
(45) Date of Patent: Jan. 15, 2019

(54) PERFORMANCE AND VERSATILITY OF SINGLE-FREQUENCY DFT DETECTORS

(71) Applicant: Leonid Matsiev, San Jose, CA (US)

(72) Inventor: Leonid Matsiev, San Jose, CA (US)

(*) Notice: Subject to any disclaimer, the term of this patent is extended or adjusted under 35 U.S.C. 154(b) by 241 days.

(21) Appl. No.: 14/846,743

(22) Filed: Sep. 5, 2015

(65) Prior Publication Data

US 2016/0069977 A1    Mar. 10, 2016

Related U.S. Application Data

(60) Provisional application No. 62/046,732, filed on Sep. 5, 2014.

(51) Int. Cl.
*G01R 35/00* (2006.01)
*G01R 27/02* (2006.01)

(52) U.S. Cl.
CPC ........... *G01R 35/005* (2013.01); *G01R 27/02* (2013.01)

(58) Field of Classification Search
None
See application file for complete search history.

(56) References Cited

U.S. PATENT DOCUMENTS

| | | | |
|---|---|---|---|
| 5,487,173 A * | 1/1996 | Greiss | G06F 9/30167 710/5 |
| 6,938,470 B2 | 9/2005 | DiFoggio | |
| 7,439,877 B1 | 10/2008 | Jarvinen | |
| 7,555,394 B2 | 6/2009 | Caffrey | |
| 7,844,401 B2 | 11/2010 | Reittinger | |
| 8,013,600 B1 | 9/2011 | Yepez | |
| 8,325,931 B2 | 12/2012 | Howard | |
| 8,412,317 B2 | 4/2013 | Mazar | |
| 8,932,868 B2 | 1/2015 | van Grinsven | |
| 2005/0225329 A1* | 10/2005 | Oakley | G01R 31/11 324/533 |

(Continued)

OTHER PUBLICATIONS

Park, S.; Grisso, B.; Inman, D.J.; Yun, C.B. A new active sensing device for wireless telemetry-based structural health monitoring. In Proceedings of the 4th International Conference on Earthquake Engineering, Taipei, Taiwan, Oct. 12-13, 2006.

(Continued)

*Primary Examiner* — Albert K Wong (57) ABSTRACT

Described herein are systems and methods for improving performance of single-frequency (single-point, single-bin) discrete Fourier transform (DFT) detectors by elimination of systematic errors from the detector output. Calibration procedures known in the art for practical implementations of such detectors do not provide adequate reduction of these systematic errors thus reducing utilization of these detectors in useful applications and products. The described methods, systems and devices allow such detectors to measure both DC and AC signals and, in latter case, considerably expand the operation frequency range without any additional hardware. These methods enable wide practical applications of DFT detectors across diverse variety of fields: from monitoring health of mechanical structures and fluid properties to impedimetric measurements in electrochemistry, monitoring of corrosion and bioimpedance.

5 Claims, 3 Drawing Sheets

(56) References Cited

U.S. PATENT DOCUMENTS

| | | | |
|---|---|---|---|
| 2008/0052028 A1* | 2/2008 | Pickerd | G01R 31/3191 |
| | | | 702/109 |
| 2010/0069781 A1 | 3/2010 | Johansen | |
| 2017/0016953 A1* | 1/2017 | Beer | G01R 31/2837 |

OTHER PUBLICATIONS

Taylor, S.G.; Farinholt, K.M.; Flynn, E.B.; Figueiredo, E.; Mascarenas, D.L.; Moro, E.A.; Park, G.; Todd, M.D.; Farrar, C.R. A mobile-agent-based wireless sensing network for structural monitoring applications. Meas. Sci. Technol. 2009, 20, 045201.

Kowalewski, M.; Lentka, G. Remote Monitoring System for Impedance Spectroscopy Using Wireless Sensor Network. In Proceedings of the XX IMEKO World Congress, Metrology for Green Growth, Busan, Korea, Sep. 9-14, 2012; p. imeko.org.

Wandowski, T.; Malinowski, P.; Ostachowicz, W. Calibration Problem of AD5933 Device for Electromechanical Impedance Measurements. In Proceedings of the EWSHM—7th European Workshop on Structural Health Monitoring, Nantes, France, Jul. 8-11, 2014; pp. 480-487.

Park, S.; Park, S.; Kim, J.; Chang, H. Debonding condition monitoring of a CFRP laminated concrete beam using piezoelectric impedance sensor nodes. In Proceedings for FraMCos-7—7th International Conference on Fracture Mechanics of Concrete and Concrete Structures, Jeju, Korea, May 23-28, 2010; pp. 1248-1254.

Mascarenas, D.D.L. Development of an Impedance Method Based Wireless Sensor Node for Monitoring of Bolted Joint Preload. Ph.D. Thesis, University of California, San Diego, CA, USA, 2006.

Mascarenas, D.L.; Todd, M.D.; Park, G.; Farrar, C.R. Remote Inspection of Bolted Joints using RFID-Tagged Piezoelectric Sensors. In Proceeding of the IMAC-XXIV: Conference & Exposition on Structural Dynamics, St. Louis, MO, USA, 2006; pp. CD-ROM.

Matsiev, L. Application of flexural mechanical resonators to simultaneous measurements of liquid density and viscosity. In Proceedings of the IEEE Ultrasonics Symposium, Lake Tahoe, NV, USA, Oct. 17-20, 1999; vol. 1, pp. 457-460.

Matsiev, L. Application of flexural mechanical resonators to high throughput liquid characterization. In Proceedings of the IEEE Ultrasonics Symposium, San Juan, Puerto Rico, Oct. 22-25, 2000; vol. 1, pp. 427-434.

Dobrinski, H.; Buhrdorf, A.; Lindemann, M.; Ludtke, O. Combi-Sensor for Oil Level and Oil Quality Management; SAE International: Warrendale, PA, USA, 2008.

Milpied, J.; Uhrich, M.; Patissier, B.; Bernasconi, L. Applications of tuning fork resonators for engine oil, fuel, biodiesel fuel and urea quality monitoring. SAE Int. J. Fuels Lubr. 2010, 2, 45-53.

Sell, J.; Niedermayer, A.; Jakoby, B. Simultaneous measurement of density and viscosity in gases with a quartz tuning fork resonator by tracking of the series resonance frequency. Proced. Eng. 2011, 25, 1297-1300.

Angelini, E.; Carullo, A.; Corbellini, S.; Ferraris, F.; Gallone, V.; Grassini, S.; Parvis, M.; Vallan, A. Handheld-impedance-measurement system with seven-decade capability and potentiostatic function. IEEE Trans. Instrum. Meas. 2006, 55, 436-441.

Majer, L.; Stopjaková, V.; Vavrinsky, E. Sensitive and accurate measurement environment for continuous biomedical monitoring using microelectrodes. Measurement Science Review, vol. 7, Section 2, No. 3, 2007; pp. 20-24.

Ferreira, J.; Seoane, F.; Ansede, A.; Bragos, R. AD5933-based spectrometer for electrical bioimpedance applications. J. Phys. Conf. Ser. 2010, 224, 012011.

Seoane, F.; Ferreira, J.; Sanchéz, J.J.; Bragós, R. An analog front-end enables electrical impedance spectroscopy system on-chip for biomedical applications. Physiol. Meas. 2008, 29, S267.

Schlebusch, T.; Rothlingshofer, L.; Kim, S.; Kony, M.; Leonhardt, S. On the road to a textile integrated bioimpedance early warning system for lung edema. In Proceedings of the International Conference on Body Sensor Networks (BSN); IEEE: Biopolis, Singapore, Jun. 7-9, 2010; pp. 302-307.

González, J.F. Textile-enabled Bioimpedance Instrumentation for Personalized Health Monitoring Applications. Ph.D. Thesis, KTH Royal, Stockholm, Sweden, 2013.

Kamat, D.; Chavan, A.P.; Patil, P. Bio-Impedance Measurement System for Analysis of Skin Diseases. Int. J. Appl. Innov. Eng. Manag. 2014, 3, 92-96.

Berney, H.; O'Riordan, J. Impedance measurement monitors blood coagulation. Analog. Dialogue 42-08, Aug. 2008, 42, 1-3.

Broeders, J.; Duchateau, S.; Van Grinsven, B.; Vanaken, W.; Peeters, M.; Cleij, T.; Thoelen, R.; Wagner, P.; De Ceuninck, W. Miniaturised eight-channel impedance spectroscopy unit as sensor platform for biosensor applications. Phys. Status Solidi. A 2011, 208, 1357-1363.

Hoja, J.; Lentka, G. Portable analyzer for impedance spectroscopy. In Proceedings of the XIX IMEKO World Congress Fundamental and Applied Metrology, Lisbon, Portugal, Sep. 6-11, 2009; pp. 497-502.

Hoja, J.; Lentka, G. A family of new generation miniaturized impedance analyzers for technical object diagnostics. Metrol. Meas. Syst. 2013, 20, 43-52.

AD5933 Datasheet; Analog Devices: Norwood, MA, USA, 2007.

Evaluation Board for the 1 Msps 12-bit Impedance Converter Network Analyzer; Analog Devices Technical Report; Analog Devices, Norwood, MA, USA, 2005.

Brennan, S. Measuring a Loudspeaker Impedance Profile Using the AD5933; Analog Devices Application Note AN-843; Analog Devices, Norwood, MA, USA, 2007; pp. 1-12.

ADuCM350 Datasheet; Analog Devices: Norwood, MA, USA, 2014.

Matsiev, L. Improving Performance and Versatility of Systems Based on Single-Frequency DFT Detectors such as AD5933. Electronics 2015, 4, 1-34.

* cited by examiner

PERFORMANCE AND VERSATILITY OF SINGLE-FREQUENCY DFT DETECTORS

RELATED APPLICATIONS

The present application is related to U.S. provisional application Ser. No. 62/046,732 filed on Sep. 5, 2014 by Leonid Matsiev.

TECHNICAL FIELD

The invention relates to concepts such as the Internet of Things (IoT), Smart Home and Smart Cities that require the development and deployment of a wide variety of computing devices incorporated into the Internet infrastructure. Unsupervised sensing is the cornerstone capability that these devices must have to perform useful functions, while also having low cost of acquisition and ownership, little energy consumption and a small footprint. Impedimetric sensing systems based on the so-called single-frequency DFT detectors possess many of these desirable attributes and are often introduced in remote monitoring and wearable devices.

Single-frequency (single-point, single-bin) discrete Fourier transform (DFT) detectors are known in the art. Such systems and devices include digital detectors or receivers also known as sine wave correlators, homodyne and synchrodyne detectors and digital synchronous quadrature detectors/demodulators.

Such detectors find practical applications across diverse variety of fields: resonator-based measurements in structural health and fluid properties monitoring, non-resonant impedimetric measurements of corrosion, electrochemistry and bioimpedance.

Without limitation, and without being bound by theory not expressly recited in the claims, the following references are representative examples of the applications in which DFT detectors are used or can be used for practical measurements:

(1) Park, S.; Grisso, B.; Inman, D. J.; Yun, C. B. A new active sensing device for wireless telemetry-based structural health monitoring. In Proceedings of the 4th International Conference on Earthquake Engineering, Taipei, Taiwan, 12-13 Oct. 2006;

(2) Taylor, S. G.; Farinholt, K. M.; Flynn, E. B.; Figueiredo, E.; Mascarenas, D. L.; Moro, E. A.; Park, G.; Todd, M. D.; Farrar, C. R. A mobile-agent-based wireless sensing network for structural monitoring applications. Meas. Sci. Technol. 2009, 20, 045201.

(3) Kowalewski, M.; Lentka, G. Remote Monitoring System for Impedance Spectroscopy Using Wireless Sensor Network. In Proceedings of the XX IMEKO World Congress, Metrology for Green Growth, Busan, Korea, 9-14 Sep. 2012; p. imeko.org.

(4) Wandowski, T.; Malinowski, P.; Ostachowicz, W. Calibration Problem of AD5933 Device for Electromechanical Impedance Measurements. In Proceedings of the EWSHM-7th European Workshop on Structural Health Monitoring, Nantes, France, 8-11 Jul. 2014; pp. 480-487.

(5) Park, S.; Park, S.; Kim, J.; Chang, H. Debonding condition monitoring of a CFRP laminated concrete beam using piezoelectric impedance sensor nodes. In Proceedings for FraMCos-7-7th International Conference on Fracture Mechanics of Concrete and Concrete Structures, Jeju, Korea, 23-28 May 2010; pp. 1248-1254.

(6) Mascarenas, D. D. L. Development of an Impedance Method Based Wireless Sensor Node for Monitoring of Bolted Joint Preload. Ph.D. Thesis, University of California, San Diego, Calif., USA, 2006.

(7) Mascarenas, D. L.; Todd, M. D.; Park, G.; Farrar, C. R. Remote Inspection of Bolted Joints using RFID-Tagged Piezoelectric Sensors. In Proceeding of the IMAC-XXIV: Conference & Exposition on Structural Dynamics, St. Louis, Mo., USA, 2006; pp. CD-ROM.

(8) Matsiev, L. Application of flexural mechanical resonators to simultaneous measurements of liquid density and viscosity. In Proceedings of the IEEE Ultrasonics Symposium, Lake Tahoe, Nev., USA, 17-20 Oct. 1999; Volume 1, pp. 457-460.

(9) Matsiev, L. Application of flexural mechanical resonators to high throughput liquid characterization. In Proceedings of the IEEE Ultrasonics Symposium, San Juan, Puerto Rico, 22-25 Oct. 2000; Volume 1, pp. 427-434.

(10) Dobrinski, H.; Buhrdorf, A.; Lindemann, M.; Ludtke, O. Combi-Sensor for Oil Level and Oil Quality Management; SAE International: Warrendale, Pa., USA, 2008.

(11) Milpied, J.; Uhrich, M.; Patissier, B.; Bernasconi, L. Applications of tuning fork resonators for engine oil, fuel, biodiesel fuel and urea quality monitoring. SAE Int. J. Fuels Lubr. 2010, 2, 45-53.

(12) DiFoggio, R.; Walkow, A.; Bergren, P. Method and Apparatus for Downhole Fluid Characterization Using Flexural Mechanical Resonators. U.S. Pat. No. 693,847, February 2005.

(13) Reittinger, P. W. System and Method for Determining Producibility of a Formation Using Flexural Mechanical Resonator Measurements. U.S. Pat. No. 7,844,401, November 2010.

(14) Sell, J.; Niedermayer, A.; Jakoby, B. Simultaneous measurement of density and viscosity in gases with a quartz tuning fork resonator by tracking of the series resonance frequency. Proced. Eng. 2011, 25, 1297-1300.

(15) Jarvinen, P. Total impedance and complex dielectric property ice detection system. U.S. Pat. No. 7,439,877, October, 2008.

(16) Yepez, E.; Roach, D.; Rackow, K.; DeLong, W. Mountable eddy current sensor for in-situ remote detection of surface and sub-surface fatigue cracks. U.S. Pat. No. 8,013,600, September, 2011.

(17) De Ceuninck, W.; van Grinsven, B.; Wagner, P. A biosensor using impedimetric real-time monitoring. WO Patent App. PCT/EP2011/071,090, June, 2012.

(18) Angelini, E.; Carullo, A.; Corbellini, S.; Ferraris, F.; Gallone, V.; Grassini, S.; Parvis, M.; Vallan, A. Handheld-impedance-measurement system with seven-decade capability and potentiostatic function. IEEE Trans. Instrum. Meas. 2006, 55, 436-441.

(19) Howard, D.; Mansell, M.; Barksdale, T.; Greenberger, H.; Hicks, M. Detecting a Loudspeaker Configuration. U.S. Pat. No. 8,325,931, December, 2012.

(20) Majer, L.; Stopjaková, V.; Vavrinsky, E. Sensitive and accurate measurement environment for continuous biomedical monitoring using microelectrodes. MEASUREMENT SCIENCE REVIEW, Vol. 7, Section 2, No. 3, 2007; pp. 20-24

(21) Licata, D.; Johansen, J.; Slizynski, R.; Love, S. Device and method for accessing and treating ducts of mammary glands. WO Patent App. PCT/US2009/040,730, October, 2009.

(22) Ferreira, J.; Seoane, F.; Ansede, A.; Bragos, R. AD5933-based spectrometer for electrical bioimpedance applications. J. Phys. Conf. Ser. 2010, 224, 012011.

(23) Mazar, S. Method and apparatus to measure bioelectric impedance of patient tissue. U.S. Pat. No. 8,412,317, April, 2013.
(24) Seoane, F.; Ferreira, J.; Sanchez, J. J.; Bragós, R. An analog front-end enables electrical impedance spectroscopy system on-chip for biomedical applications. Physiol. Meas. 2008, 29, S267.
(25) Schlebusch, T.; Rothlingshofer, L.; Kim, S.; Kony, M.; Leonhardt, S. On the road to a textile integrated bioimpedance early warning system for lung edema. In Proceedings of the International Conference on Body Sensor Networks (BSN); IEEE: Biopolis, Singapore, Jun. 7-9, 2010; pp. 302-307.
(26) Gonzalez, J. F. Textile-enabled Bioimpedance Instrumentation for Personalized Health Monitoring Applications. Ph.D. Thesis, KTH Royal, Stockholm, Sweden, 2013.
(27) Kamat, D.; Chavan, A. P.; Patil, P. Bio-Impedance Measurement System for Analysis of Skin Diseases. Int. J. Appl. Innov. Eng. Manag. 2014, 3, 92-96.
(28) Berney, H.; O'Riordan, J. Impedance measurement monitors blood coagulation. Analog. Dialogue 42-08, Auguest, 2008, 42, 1-3.
(29) Broeders, J.; Duchateau, S.; van Grinsven, B.; Vanaken, W.; Peeters, M.; Cleij, T.; Thoelen, R.; Wagner, P.; de Ceuninck, W. Miniaturised eight-channel impedance spectroscopy unit as sensor platform for biosensor applications. Phys. Status Solidi. A 2011, 208, 1357-1363.
(30) Hoja, J.; Lentka, G. Portable analyzer for impedance spectroscopy. In Proceedings of the XIX IMEKO World Congress Fundamental and Applied Metrology, Lisbon, Portugal, 6-11 Sep. 2009; pp. 497-502.
(31) Hoja, J.; Lentka, G. A family of new generation miniaturized impedance analyzers for technical object diagnostics. Metrol. Meas. Syst. 2013, 20, 43-52.

BACKGROUND ART

Conventional DFT detectors known in the art are widely utilized in digital signal processing and test equipment to measure the spectra of signals from various sources and devices under test (DUTs). Such DFT detectors calculate the dot product of a sampled and digitized signal vector and the test vector of sampled complex-valued function $\cos(2\pi ft)-i\sin(2\pi ft)$ of time t and test frequency f internally generated so that the test vector contains integer number of function cycles. This complex-valued test vector is also called test phasor. The dot product is a single complex value, the real part of which is often referred to as the in-phase component, and the imaginary as the quadrature component of the signal. The detector outputs holding these two values are referred to as the in-phase and quadrature channels of the detector.

To produce a spectrum DFT detectors generate a comb of test frequencies f within a range. The narrower the spacing between neighboring frequencies in the comb the higher the spectral resolution of the instrument. Due to the periodic nature of the test function however high spectral resolution requires very long test vectors to keep the number of cycles integral, which in practice leads to very long memory buffers and requires substantial computational power. While manageable in expensive test equipment, these factors are challenging in low-power remote monitoring systems and low-cost single-chip implementations.

It is also known in the art that while the test vector contains an integer number of cycles at all test frequencies within the spectrum, the frequency of input signal may not coincide with any of those test frequencies. In this case the vector of sampled signal does not contain the integer number of signal cycles—the signal is called "non-coherently sampled." It means that the first and the last sample of the signal sinusoid are discontinuous with one another and the sampled signal vector is sometimes called "discontinuous." This causes a problem well known in the art as "spectral leakage": instead of producing a single peak at a signal frequency the components of such signal appear at a number of neighboring test frequencies creating erroneous broadening of spectral lines, false peaks and troughs, and a general increase in noise floor. The signal is said to be "leaking" from the frequency point where the signal peak is supposed to be located into the neighboring frequencies, where the test vectors are continuous.

It is also known in the art that DFT detectors can operate as a part of a network analyzer by synthesizing stimulus signal coherent with the continuous test vector or a component thereof, typically the $\cos(2\pi ft)$, which ensures stimulus continuity. The stimulus is applied to the device under test (DUT) and the device response is sampled as input signal to the detector. Except for special cases, this guarantees that the DUT's response is also continuous and the effects of spectral leakage are nonexistent.

What is overlooked in the art is that low-cost implementations of the DFT detectors, while formally calculating the same dot product of sampled signal vector and test vector, utilize a test vector of a limited length, which rarely contains an integer number of cycles and therefore is discontinuous. Such discontinuous test vectors do not constitute an orthogonal Fourier basis and therefore the calculated dot product should not be called "Fourier transform" and such a detector cannot be considered a true DFT detector.

The use of these discontinuous test vectors gives rise to a variety of unexpected artifacts in the detector output. Even in network analyzer mode, when the stimulus is coherently synthesized from a discontinuous test vector and applied to the DUT, the response is also discontinuous and the accuracy expected from a true DFT detector is not achieved. In the cited art, such deviations from expected DFT behavior are erroneously attributed to spectral leakage, when, in fact, they are completely different in nature.

It is well known in the art that if a true DFT detector is presented with a constant signal (DC), both the in-phase and quadrature output components are zero. It is also well known in the art that a constant signal cannot produce spectral leakage. If the DFT detector with discontinuous test vectors is presented with a constant DC signal, both the in-phase and quadrature output components show substantial frequency-dependent values, so the DC signal "leaks" into both detector outputs. For lack of established terminology, this phenomenon can be called "DC leakage."

It is well known in the art that if an AC signal is coherently synthesized from the cosine component of a continuous test vector and delivered to the input of the DFT detector, the in-phase component will contain the amplitude of the synthesized signal, while the quadrature component will be zero and there will be no spectral leakage. If the same experiment is performed with a discontinuous test vector, the in-phase component will contain the distorted amplitude of the signal, while the quadrature component will be non-zero; therefore, some of the signal from the in-phase channel "leaks" into the quadrature channel and vice versa (intra-channel cross-talk). For lack of established terminology, this phenomenon can be called "AC leakage."

The effects of the DC and AC leakage can exceed the measured signal when only a few full cycles and a fraction thereof fits within the length of the discontinuous test vector rendering the detector useless. The higher the test frequency, the more full cycles can fit within of the discontinuous test vector, the lower the DC and AC leakage. As test frequency increases, the levels of the DC and AC leakage decrease and may become lower than the acceptable error threshold for a given application; however, without the knowledge of the existence and behavior of DC and AC leakage, it is impossible to determine the frequency range in which a particular implementation of the detector can operate.

As the effects of the DC and AC leakage were erroneously attributed to spectral leakage, windowing—the well-known method for spectral leakage suppression—is applied. While helping to a certain degree, windowing further obscures the nature of the DC and AC leakage and still does not allow DFT detectors to operate at full frequency range and accuracy afforded by the hardware. The equations in the remaining text assume that Hann window is implemented in the DFT detector.

The present invention discloses:
 i. the existence of the artifacts caused by discontinuous test vector: DC and AC leakage
 ii. that DC and AC leakage are functions of the test vector length (i.e. number of samples) and the ratio of the test frequency to the sampling frequency
 iii. that these functions can be expressed in close form for a practical implementation of the detector
 iv. the way these functions are used to eliminate the DC and AC leakage from the detector output greatly increasing the detector accuracy, expanding operation frequency range and without any additional hardware While it is known in the art that conventional DFT detectors are blind to DC signals, the present invention discloses the use of the DC leakage to enable measurement of DC signals by DFT detectors with discontinuous test vector.

While there may be multiple ways of implementing DFT detectors utilizing various hardware designs and digital signal processors (DSPs), of a particular interest for practical applications are the commercially available, single-chip DFT devices designed specifically for impedimetric applications by Analog Devices:

(32) AD5933 Datasheet; Analog Devices: Norwood, Mass., USA, 2007.
(33) Caffrey, J. F.; Geraghty, D. P.; Lyden, C. G.; O'Grady, A. C.; Slattery, C. F.; Smith, S. Measuring Circuit and a Method for Determining a Characteristic of the Impedance of a Complex Impedance Element for Facilitating Characterization of the Impedance Thereof. U.S. Pat. No. 7,555,394, June, 2009.
(34) Evaluation Board for the 1 Msps 12-bit Impedance Converter Network Analyzer; Analog Devices Technical Report; Analog Devices, Norwood, Mass., USA, 2005.
(35) Leonard, E. Optimize Speaker Impedance Matching for Best Audio Results. EE Times, 26 Apr. 2006, p. id=1274771.
(36) Brennan, S. Measuring a Loudspeaker Impedance Profile Using the AD5933; Analog Devices Application Note AN-843; Analog Devices, Norwood, Mass., USA, 2007; pp. 1-12.
(37) ADuCM350 Datasheet; Analog Devices: Norwood, Mass., USA, 2014.

All the art cited above is predominantly focusing on the end applications and lacks specific error analysis in conjunction with operation frequency range and calibration methods, relying heavily on the information from the device datasheet. For example, the operating frequency range with a 16 MHz clock is stated to be from 1 KHz to 100 KHz with the system accuracy of 0.5%. for the impedance dynamic range of 1 k$\Omega$ to 10 M$\Omega$, but no experimental data on accuracy given.

The calibration procedure proposed in the AD5933 datasheet and widely replicated in the literature does not take into account the artifacts caused by discontinuous test vector (phasor): resulting from the DC offset at the detector input and the cross-talk between in-phase and quadrature channels. The calibration procedure described in the art produces a single multiplicative gain factor that leads to rather sizeable systematic errors and undue disappointment in the device performance (see publication (4)), especially at the lower end of the operation frequency range.

Notwithstanding the various advances known in the art in connection with utilization of DFT detectors, there remains a need in the art for improvements, especially improvements which enhance the accuracy and versatility of such detectors in a variety of applications, allowing for reduction in hardware, footprint, power consumption, cost and environmental impact of the resulting electronic products.

DISCLOSURE OF INVENTION

The present invention discloses system and methods related to operation of DFT detectors with discontinuous test vector in a network analyzer mode whereas a stimulus is synthesized based on a part of said test vector.

More specifically this invention discloses a method and a system that eliminates all sources of errors caused by discontinuous test vectors. This method achieves accuracy limited only by the hardware: errors resulting from the digital implementation of the DFT, inaccuracy of the direct digital synthesizer (DDS), signal digitization by sampling ADC and fixed-point arithmetic truncation in DFT core.

More specifically this invention discloses a method and a system that measures both AC and DC signals utilizing the same DFT detector hardware for both types of measurements.

More specifically this invention discloses a method that significantly extends operation frequency range of the DFT detector, especially the lower limit, without using additional hardware.

The in-phase and quadrature values $S_I$ and $S_Q$ produced by the DFT detector in response to DC signal are proportional to the signal magnitude and therefore can be conveniently expressed by in-phase $G_I$ and quadrature $G_Q$ gain factors. The present invention discloses that these DC leakage gain factors can be explicitly expressed as follows:

$$G_I = \frac{\operatorname{Sin}^2\left(\frac{\pi}{N}\right)\operatorname{Sin}(2\pi f N)}{4\operatorname{Sin}\left(\pi\left(\frac{1}{N}+f\right)\right)\operatorname{Sin}\left(\pi\left(\frac{1}{N}-f\right)\right)\operatorname{Tan}(\pi f)} \quad (1)$$

$$G_Q = -\frac{\operatorname{Sin}^2\left(\frac{\pi}{N}\right)\operatorname{Sin}^2(\pi f N)}{2\operatorname{Sin}\left(\pi\left(\frac{1}{N}+f\right)\right)\operatorname{Sin}\left(\pi\left(\frac{1}{N}-f\right)\right)\operatorname{Tan}(\pi f)},$$

where f is a normalized test frequency (test frequency divided by sampling frequency) and N is the total number of samples used to perform DFT. Therefore the magnitude of the DC signal can be obtained by dividing detector output by correspondent gain factor: $S_I/G_I$ or, equivalently, $S_Q/G_Q$, or by calculating both and averaging. Skilled in the art may choose to perform such calculations for a plurality of frequencies f and average the results.

Without loss of generality, let's assume that the Cos(2πft) component of the test vector is used to synthesize the coherent AC stimulus. The in-phase and quadrature values produced by the AC response to the stimulus as well as the cross-talk contribution are proportional to the signal amplitude and depend on signal phase therefore can be expressed by a matrix equation:

$$\begin{pmatrix} S_I \\ S_Q \end{pmatrix} = \begin{pmatrix} a & b \\ b & d \end{pmatrix} \begin{pmatrix} A\cos(\varphi) \\ A\sin(\varphi) \end{pmatrix},$$

where $S_I$ and $S_Q$ are the DFT detector outputs, diagonal matrix elements a and d are the in-phase and quadrature gains, matrix element b is the cross-talk factor, A and $\varphi$ are the AC signal amplitude and phase.

The present invention discloses that said matrix elements a, b and d can be explicitly expressed as follows:

$$a = \frac{1}{4}\left(N + \frac{\sin^2\left(\frac{\pi}{N}\right)\sin(4\pi fN)}{2\sin\left(\pi\left(\frac{1}{N}+2f\right)\right)\sin\left(\pi\left(\frac{1}{N}-2f\right)\right)\tan(2\pi f)}\right) \quad (2)$$

$$b = \frac{\sin^2\left(\frac{\pi}{N}\right)\sin(2\pi fN)}{4\sin\left(\pi\left(\frac{1}{N}+2f\right)\right)\sin\left(\pi\left(\frac{1}{N}-2f\right)\right)\tan(2\pi f)}$$

$$d = \frac{1}{4}\left(N - \frac{\sin^2\left(\frac{\pi}{N}\right)\sin(4\pi fN)}{2\sin\left(\pi\left(\frac{1}{N}+2f\right)\right)\sin\left(\pi\left(\frac{1}{N}-2f\right)\right)\tan(2\pi f)}\right),$$

where f is a normalized test frequency (test frequency divided by sampling frequency) and N is the total number of samples used to perform DFT.

The present invention discloses that with the expressions (2) above, it is possible to calculate all three matrix elements a, b and d for any frequency f and length of the sampled signal vector N and then for any detector output values of $S_I$ and $S_Q$ to completely eliminate the AC leakage by simply solving the system of linear equations for $A\cos(\varphi)$ and $A\sin(\varphi)$:

$$\begin{pmatrix} S_I \\ S_Q \end{pmatrix} = \begin{pmatrix} a & b \\ b & d \end{pmatrix} \begin{pmatrix} A\cos(\varphi) \\ A\sin(\varphi) \end{pmatrix} \Rightarrow A\cos(\varphi) = \frac{bS_Q - dS_I}{b^2 - ad}; \quad (3)$$

$$A\sin(\varphi) = \frac{bS_I - dS_Q}{b^2 - ad}$$

The resulting values $A\cos(\varphi)$ and $A\sin(\varphi)$ are the true in-phase and quadrature components of the signal as accurate as if they were measured by true DFT detector. Once this approach is disclosed, skilled in the art can derive similar expressions in case a different component of test vector Sin(2πft) or a combination of the two components is used to synthesize the coherent stimulus.

Detailed derivation of the above expressions is given in (38) Matsiev, L. Improving Performance and Versatility of Systems Based on Single-Frequency DFT Detectors such as AD5933. Electronics 2015, 4, 1-34.

The present invention discloses that if the DFT detector has internal DC offset, the detector response to DC offset within working frequency range must be recorded and stored in some form of intermediate memory. Matrix elements a, b and d have to be calculated and stored in some form of intermediate memory for the same working frequency range at the same set of frequency points. In presence of AC signal of interest detector outputs $S_I$ and $S_Q$ have to be recorded within same working frequency range at the same set of frequency points and the DC data stored earlier must be subtracted from $S_I$ and $S_Q$ at each frequency point. Then thus corrected values $S_I$ and $S_Q$ and matrix elements a, b and d must be substituted into expressions (3) and the in-phase $A\cos(\varphi)$ and quadrature $A\sin(\varphi)$ components of the AC signal of interest calculated.

Those skilled in the art would appreciate that, without loss of generality, multiple variations of this procedure yielding the same result can be implemented. For example, matrix elements a, b and d can be calculated at the instance the detector outputs $S_I$ and $S_Q$ have been acquired, earlier collected DC responses subtracted and expressions (3) evaluated "on the fly" at a given frequency point using less intermediate storage, etc.

The present invention discloses that application of these methods of error elimination achieves the maximum accuracy possible for a given DFT detector implementation. The remaining systematic accuracy-limiting factors are intrinsic to the detector digital design: truncation of the test vector amplitude and phase, limited resolution of the digitized input, truncations in the DFT fixed-point arithmetic, etc.

The present invention discloses that the expressions above allows for easy identification and correction of the fixed-point arithmetic overflow that may occur depending on given implementation of the DFT and the magnitude of the input DC and AC signals. As any fixed-point implementation restricts the dynamic range of the operands involved in the DFT calculations due to the hardware-limited bitlength, the dot product calculations may result in overflow. With the developed knowledge of the DC and AC leakage as a function of normalized frequency it is straightforward to anticipate the overflow near the extrema of the in-phase and quadrature gains $G_I$, $G_Q$, a and d and correct for it once it occurs.

Various further aspects, embodiments and features of the invention are described herein throughout the specification and drawings. Various features of the invention, including features defining each of the various aspects of the invention, including general and preferred embodiments thereof, can be used in various combinations and permutations with other features of the invention. Features and advantages are described herein, and will be apparent from the Drawings and the following Modes for Carrying out the Invention and examples further describing the invention.

BRIEF DESCRIPTION OF DRAWINGS

FIG. 1 (A-C) illustrate experimentally observed internal DC leakage $\Delta_{Re}$ and $\Delta_{Im}$: data from the AD5933 "Real" and "Imaginary" output registers respectively, collected over three frequency ranges from low to high (FIG. 1A), (FIG. 1B) and (FIG. 1C).

FIG. 5 (A, B) illustrate method performance for measuring the response of a 140 kΩ resistor as DUT: (A): raw data $S_{Re}$ and $S_{Im}$ and (B): data processed according to the invention utilizing equations (3) left y-axis for A Cos(φ) and right y-axis for A Sin(φ). Systematic error exceeding tens percent is reduced by processing the data to below 1% for the most of the frequency range.

Various aspects of the figures are described in further detail below, in connection with the Modes for Carrying out the Invention.

MODES FOR CARRYING OUT THE INVENTION

The examples of impedimetric systems on a chip based on DTF detector are the AD5933, AD5934 and ADuCM350 by Analog devices. According to the AD5933 datasheet, the AD5933 is an impedance converter system solution that combines a programmable direct digital synthesizer (DDS) with a sampling ADC, Hann window, and a DFT detector that returns real and imaginary data-words at a fixed sampling frequency and pre-programmed test frequency. The AD5933 device is a nearly ideal platform for implementation of the invented methods as it dramatically exhibits all the effects of the single-frequency DFT detector-based system described in the Disclosure of Invention above.

Applications based on AD5933 can greatly benefit from the invented methods as the calibration techniques described in the datasheet and widely replicated in the literature are often inadequate. Also, there is an interest in low-frequency applications of this integrated circuit for measuring bio-impedance, corrosion, fluid monitoring, structural health, water quality, and properties of loudspeakers, manifested in a number of publications listed above. The known solution to AD5933 low-frequency operation is based on dividing down the external clock frequency, which requires additional hardware. The invented methods allow for significant expansion of the low end of the frequency range without any additional hardware.

The only hardware necessary to demonstrate the invention is the commercially available AD5933 evaluation board by Analog Devices. To illustrate the performance of the invented methods high-accuracy, calibrated resistors and capacitors were utilized. The evaluation board is supplied with the software that allows the user to communicate with the AD5933 over the USB interface, setup and perform frequency sweeps and store the data from "Real" and "Imaginary" registers of the AD5933 as text files. "Real" and "Imaginary" data registers correspond to in-phase and quadrature outputs of the DFT detector discussed earlier.

The AD5933 is a complete single-chip network analyzer: it synthesizes its own excitation voltage, performs current defection, sampling, A-to-D conversion and DFT processing. As such, it is a closed system (a "black box") that can be best characterized by using known calibrated impedances as DUTs and observing whether the digital output conforms to the response predicted by theory for a given DUT.

To bridge the gap between the expressions provided in previous sections and practical application, it is necessary to provide values for the variables. From the AD5933 datasheet, the length of the sampled signal vector is 1024, so N=1024. From the block overview diagram of the AD5933 in the datasheet [FIG. 17] it follows that the direct digital synthesizer (DDS) of the device also provides synchronous cosine/sine test vector (phasor) to the DFT module, so it is necessary to connect the normalized frequency f and the frequency control word for the synthesizer. In the AD5933 datasheet the DDS frequency control word is also referred to as the Frequency Code and this notation will be used for the remainder of this text.

The DDS is based on a 27-bit phase accumulator, which increments by the Frequency Code at every tick of the system clock; therefore, the frequency of the accumulator overflows is Frequency Code/$2^{27}$. Although not stated explicitly, from the text in the datasheet it follows that the sampling of the input (and also the test vector) takes place every 4 accumulator increments. Then the current phase of the test vector at a given summation index k is $2\pi \cdot (4 \cdot$Frequency Code/$2^{27}) \cdot k$ plus some residual value from the accumulator previous overflow. Therefore, the normalized frequency f=4·Frequency Code/$2^{27}$ or f=Frequency Code/$2^{25}$.

As is typical for the digital systems such as DDS and DFT, all the considerations above are independent of the physical frequency. According to the datasheet, the accumulator increments every fourth cycle of the clock oscillator (internal or external) and thus the system physical frequency is $(f_{Clk}/4)$(Frequency Code/$2^{27}$)=$f_{Clk}$·Frequency Code/$2^{29}$, where $f_{Clk}$ is the clock oscillator frequency. In the interest of clarity, the experimental results are presented with the reference to the Frequency Code, as it is easy to convert back and forth between the latter and either the normalized frequency f or physical frequency based on the source of system clock.

The characteristic feature of the AD5933 not explicitly mentioned in the datasheet is that the substantial DC offset is always present at the input of the DFT detector. The datasheet [FIG. 20] shows the "receive stage" of the device, depicting the VDD/2 voltage to be constantly present at the output of the amplifiers and at the input of the ADC in the absence of external circuits connected to pin 5 (VIN). Therefore, some binary number of a magnitude close to half of the ADC full scale is always present at the input of the DFT detector by design.

To observe the effect of this DC leakage experimentally it is sufficient to disconnect everything, except the feedback resistor, from the pin 5. This turns the internal amplifier circuit of the receiving stage into a voltage follower that passes VDD/2 to the ADC input. The exact value of the feedback resistor is not important in these measurements, but the feedback resistor $R_{fb}$ of 200 kΩ was utilized. Then a sweep can be performed by programming the AD5933 with the parameters shown in Table 1 (as referred to in the datasheet).

TABLE 1

Sweep parameters.

| | |
|---|---|
| Start Frequency Code | 350 |
| Frequency Increment Code | 150 |
| Number of Increments | 511 |
| Output Voltage Range | Any |
| Programmable Amplifier Gain | Any |
| External/Internal system clock | Any |
| Number of Settling Cycles Register D0-D8 | Any, except 0 |
| Number of Settling Cycles Register D9-D10 | 0 |

To distinguish experimental data from the correspondent identifiers $S_I$ and $S_Q$ in the expressions, the internal DC leakage data collected from the AD5933 output registers is designated as $\Delta_{Re}$ and $\Delta_{Im}$ respectively.

Figure 1A:
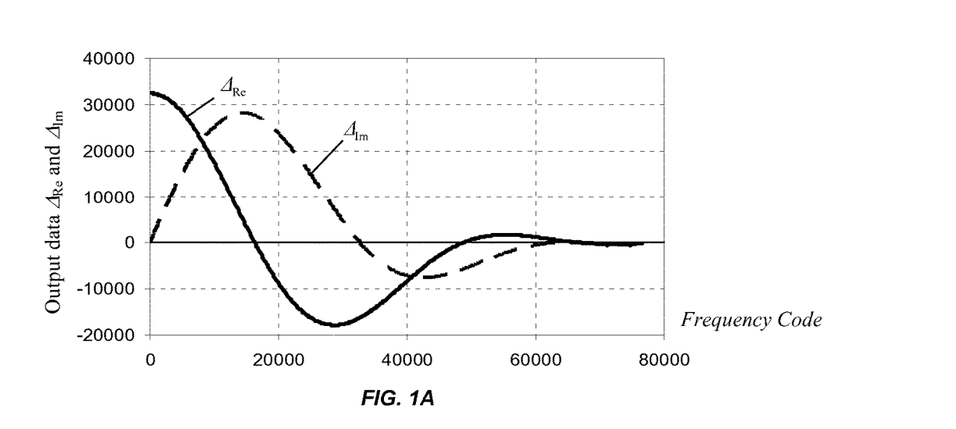
Figure 1B:
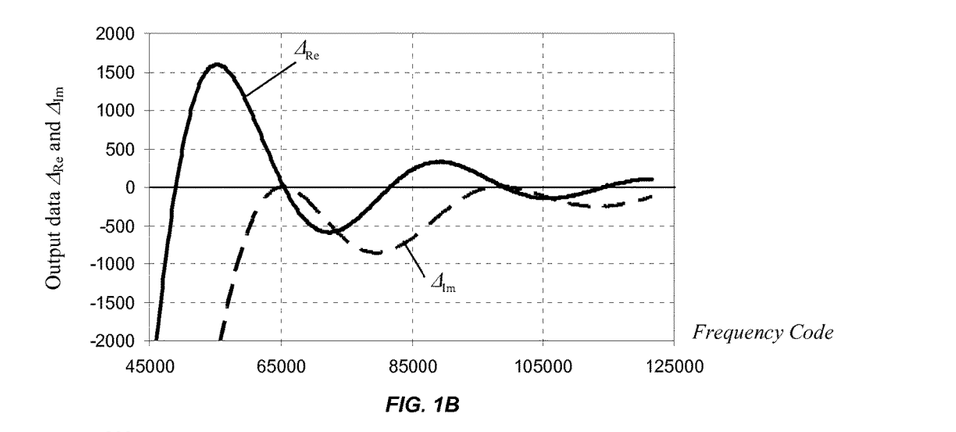
Figure 1C:
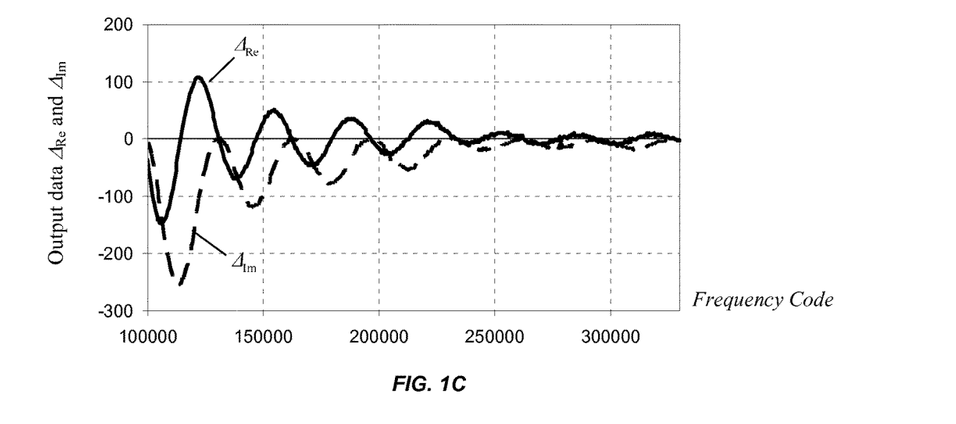

The "Real" and "Imaginary" data behave predominantly as predicted by the formulae (2) for $\Delta_I$ and $\Delta_Q$ respective gain factors $G_I$ and $G_Q$ in the range of f from 0 to 2/N corresponding to Frequency Code from 0 to 80000 (FIG. 1A), except for the inversion of the imaginary data and some additional gain in both channels. The likely reason for the inversion is that the minus sign in front of the sum of samples of the test sine vector in the DFT core is implied, but not implemented in the AD5933 device. A sweep with the same set of parameters except for starting at Frequency Code=45000 produces the $\Delta_{Re}$ and $\Delta_{Im}$ data shown in (FIG. 1B). Again, the data collected from the device behave as predicted by the formulae (1) for $G_I$ and $G_Q$ in the range of f above 2/N. Sweeping further with the same parameters, except for higher Start Frequency Code=100000 and Frequency Increment Code=450, it is easy to observe that the behavior predicted by the formulae (1) continues at higher frequencies, see (FIG. 1C). Although decreasing in magnitude with increasing Frequency Code, the DC leakages $\Delta_{Re}$ and $\Delta_{Im}$ still far exceed other sources of errors—irregular ripples barely visible on the chart (FIG. 1C). Unless this effect of the DC leakage is taken into account and eliminated using the proposed method, the data from AD5933 contains a significant systematic error and the device cannot be utilized to its full potential.

The above experiments can be easily reproduced at higher frequencies to observe that the error from the DC leakage decreases further, but still stays rather prominent in comparison to intrinsic system inaccuracies, noise and interference at all frequencies within the advertised operating frequency range. The calibration method recommended in the datasheet aims to correct only for multiplicative gain and the resulting accuracy suffers greatly from this DC leakage systematic error, which is additive in nature. Narrowing the frequency range, assuming the gain linearly changing across the sweep and using multi-point calibration as advised do not help much, as the DC leakage error oscillates with the frequency.

To remove the effects of the DC leakage the following steps have to be taken:
1. Disconnect any circuits except for the feedback resistor from pin 5 (VIN).
2. Take a sweep within the intended frequency range and store data in some kind of memory, in a microcontroller, host PC, etc.
3. Connect the circuit of interest to pin 5 and take a sweep.
4. Subtract the recorded data from the collected data—the result is the response of the circuit of interest.

The additional benefit of this method is that, due to additive nature of the DFT, other errors that are stable in time will all be subtracted from the signal of interest.

Figure 2:
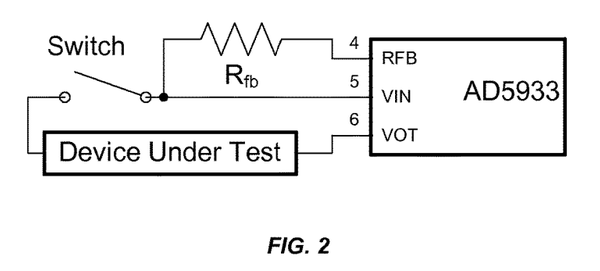
FIG. 2 illustrates simplified schematic for practicing the invention with AD5933, more specifically, for eliminating AD5933 internal DC leakage from network analysis: internal DC offset is processed by the on-chip circuitry and recorded when the switch is open.

A simplified schematic for performing the proposed procedure for the network analysis—the intended purpose of AD5933—is illustrated in (FIG. 2). The network is shown as the two-port Device Under Test (DUT). The DUT is not necessarily limited to a two-port circuit such as some passive impedance network, but could also represent a more complex multi-port network, for example, a filter, or an active circuit such as an audio amplifier or an active filter, analog front end (AFE) circuit, etc. The switch is shown in open position for acquisition and recording of the DC leakage sweep to be subtracted from the following measurements of the DUT response to the AC excitation voltage from pin 6 (VOUT) when the switch is closed. The switch can also be replaced by a relay, analog semiconductor switch, and any other such means to provide the necessary switching function for temporary isolating the VIN node.

Depending on the specific nature of the DUT, it may also transfer some or all of the DC component of the excitation voltage from pin 6 (VOUT) to VIN node, so care must be taken to block this DC.

Figure 3:
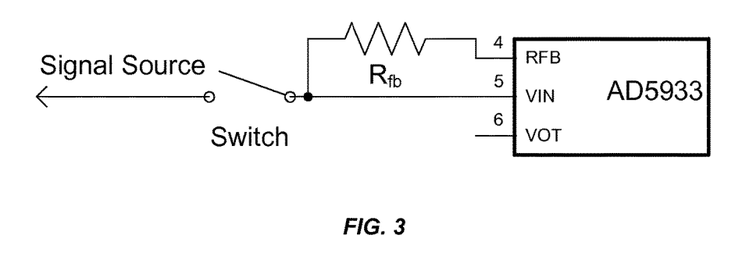
FIG. 3 illustrates simplified schematic for practicing the invention with AD5933, more specifically, for eliminating AD5933 internal DC leakage from AC signal: internal DC offset is processed by the on-chip circuitry and recorded when the switch is open.

Similarly, a simplified schematic for performing the proposed procedure for measuring the external signal is illustrated on (FIG. 3). The switch is shown in open position for acquisition and recording of the DC leakage sweep to be subtracted from the following measurements of the signal of interest. Depending on the application, the excitation voltage from pin 6 (VOUT) may or may not be utilized for synchronization of the external signal source.

The expressions (1) and experiments identified the frequency ranges, where the DFT detector produces substantial gains for DC leakage, both in "Real" (in-phase) and "Imaginary" (quadrature) data. A single frequency measurement within such frequency range is sufficient to obtain the accurate value of a DC signal.

Figure 4:
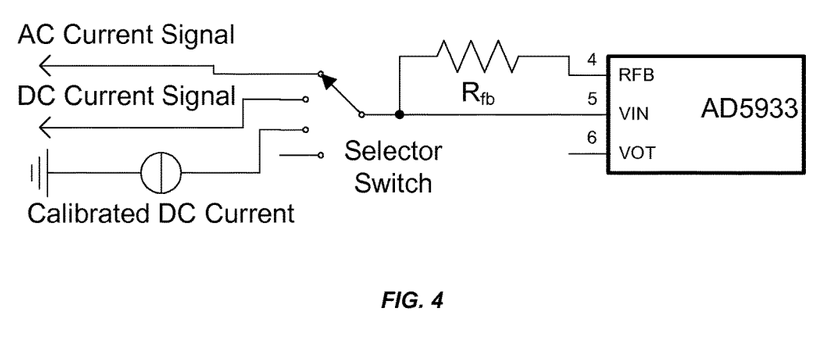
FIG. 4 illustrates simplified schematic for practicing the invention with AD5933. The selector switch allows for calibration, DC and AC measurements with the same hardware: internal DC offset is processed by the on-chip circuitry and recorded when the selector switch is at the bottom, system DC gain is measured when the switch is connected to a calibrated DC current source. Same system measures AC current when the selector switch is in top position.

A simplified schematic for performing the procedure is shown in (FIG. 4). For illustration purposes let us assume that a user prefers to measure the DC signal utilizing the data from "Imaginary" data register. Looking at (FIG. 1A) it is easy to see that the DC leakage gain reaches maximum around f≈1.3/N, which corresponds to Frequency Code of about 14450 (~433 Hz at 16 MHz system clock frequency).

The procedure is as follows:
1. Disconnect the input VIN node (selector bottom position).
2. Program the Frequency Code into AD5933, and initiate the single-frequency measurement, read the content of the imaginary data register and store it.
3. Connect VIN node to calibrated DC source, initiate the single-frequency measurement, read the content of the imaginary data register, subtract the value stored in step 2 value, calculate the ratio of the found difference to the calibrated DC source magnitude and store it—this is the system gain for DC signals.
4. Switch to connect to the unknown DC signal, initiate the single-frequency measurement, read the content of the imaginary data register, subtract the value stored in step 2 value, divide by the system gain from step 3—the result is the DC signal of interest.

Equivalently, this method can be practiced with the real register data at frequency codes that correspond to acceptable gain values. Using data at a single frequency point from a single data register constitutes a minimalistic version of this method, but the data from one or both real and imaginary registers at a single frequency or multiple frequencies, or data from a whole frequency sweep within suitable range, can be utilized to arrive at the DC signal value. While these versions of the proposed method may provide somewhat better statistics, additional measurement time and processing may prove to produce diminishing returns and have to be tailored to the application-specific requirements.

The methods and the schematics in (FIG. 2), (FIG. 3) and (FIG. 4) can be combined for switching detector such as AD5933 between measuring DC leakage, calibration, using the same DDS and DFT hardware for measuring DC and AC signals and performing the functions of network analysis.

It has been noted earlier that the practical implementation of the DFT in AD5933 inverts the sign of the dot product of the sampled input and the sine component of test vector. Also, to the contrary of what is reported in the literature, AD5933 synthesizes and outputs the excitation voltage in a form of a sine wave Sin(2πft) and not the cosine Cos(2πft) as is customary in the DFT textbooks. To account for these two particularities it makes sense to designate the data produced by the AD5933 as $S_{Re}$ and $S_{Im}$ to distinguish these from the correspondent identifiers $S_I$ and $S_Q$ introduced earlier and the matrix expression (3) now takes a different form:

$$\begin{pmatrix} S_{Re} \\ S_{Im} \end{pmatrix} = \begin{pmatrix} -b & a \\ d & -b \end{pmatrix} \begin{pmatrix} A\cos(\varphi) \\ A\sin(\varphi) \end{pmatrix}.$$

Still, the AC leakage is eliminated by solving this matrix equation for A Cos(φ) and A Sin(φ), which yields the following:

$$A\cos(\varphi) = \frac{bS_{Re} - aS_{Im}}{ad - b^2}; \qquad (4)$$

$$A\sin(\varphi) = \frac{dS_{Re} - bS_{Im}}{ad - b^2}.$$

Detailed derivation of the above expressions accounting for AD5933-specific operation is given in (38) Matsiev, L. Improving Performance and Versatility of Systems Based on Single-Frequency DFT Detectors such as AD5933. Electronics 2015, 4, 1-34. Skilled in the art would immediately appreciate that the expression (3) can be similarly adjusted to account for an excitation signal coherent with any of the test vector component at any phase and for any sign of the calculated dot product.

Also, in AD5933 the DFT results are held in the 16-bit "Real" and "Imaginary" registers, which can hold values between 0 and $2^{16}-1$ only and, as it was mentioned earlier, may overflow. The datasheet does not mention any hardware means to flag this condition and the software provided with the evaluation board offers no means of detecting and correcting the overflow.

The proposed method allows for easy overflow identification and correction by comparing the sign of the collected data to the one predicted by expressions (1) and (3). In the experiments below, when the overflow occurs, the sign of the overflown data turns negative—the opposite of what is predicted by the theory and such data can be corrected by simply adding $2^{16}$ to it.

To experimentally observe the effects of DFT low-frequency behavior discussed in the theoretical section, after recording the DC leakage sweep with the feedback resistor $R_{fb}$ of 200 kΩ as explained in the previous section (please see (FIG. 2), (FIG. 3) and (FIG. 4)), a test resistor of 140 kΩ is connected between pin 6 (VOUT) and pin 5 (VIN) (in place of the DUT on (FIG. 2)) through an additional circuit, ensuring that no DC current is flowing across the test resistor. The test sweep is performed with the settings same or similar to the ones used in the DC leakage section, please see Table 2.

TABLE 2

| Sweep parameters. | |
|---|---|
| Start Frequency Code | 350 |
| Frequency Increment Code | 150 |
| Number of Increments | 511 |
| Output Voltage Range | 2 V |
| Programmable Amplifier Gain | 1 |
| External/Internal system clock | Any |
| Number of Settling Cycles Register D0-D8 | 1 |
| Number of Settling Cycles Register D9-D10 | 0 |

Figure 5A:
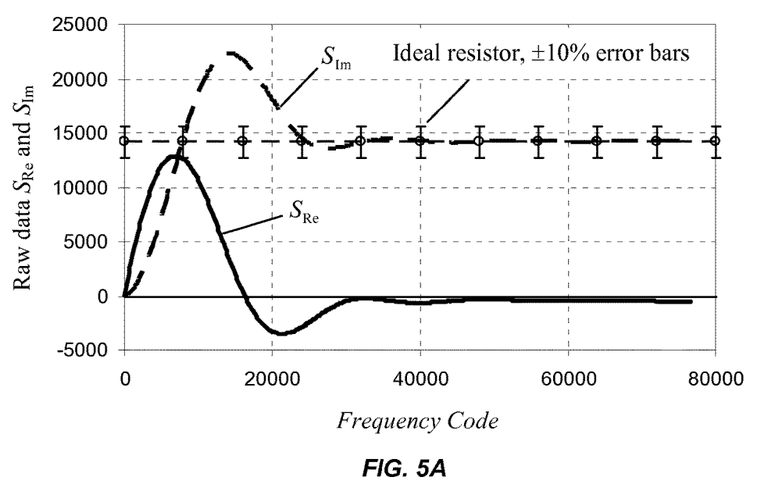

The output data "Re" and "Im" collected from the "Real" and "Imaginary" registers is corrected for the fixed-point overflow and $\Delta_{Re}$ and $\Delta_{Im}$—the DC leakage sweep recorded earlier—is also subtracted. The resulting data $S_{Re}=\text{Re}-\Delta_{Re}$ and $S_{Im}=\text{Im}-\Delta_{Im}$ is plotted on (FIG. 5A).

Figure 5B:
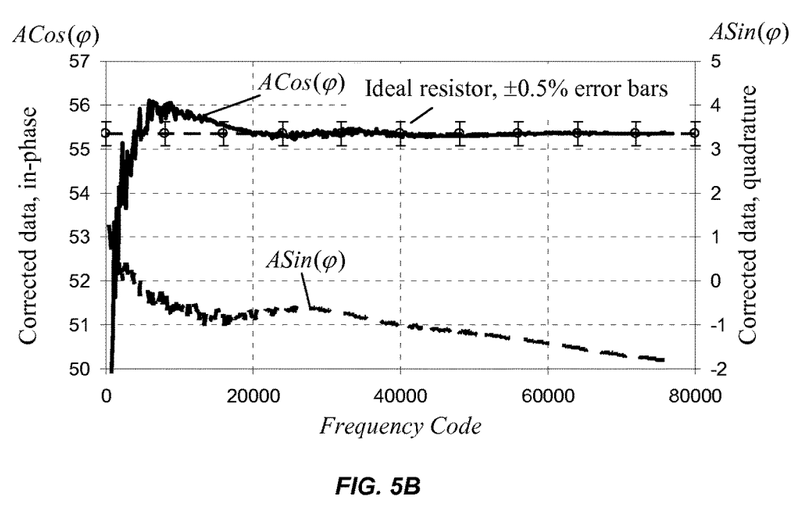

To process the experimental data shown on (FIG. 5A), it is necessary to calculate the three matrix coefficients a, b and d by substituting N with 1024 and f with 4·Frequency Code/$2^{27}$ in the expressions (2). This experimental data corrected for leakage utilizing the invented method is shown on (FIG. 5B). The y-axis for the in-phase component of the signal A Cos(φ) is on the left and the y-axis for the quadrature component A Sin(φ) is on the right—both y-axes are of the same scale, but of different origins to better show the transitions.

The experimental data processing steps according to the invented method are illustrated in Table 3, where the first column is Frequency Code, second and third columns are the internal DC leakage, fourth and fifth columns are the raw AC response of the resistor, sixth and seventh columns—DC leakage is subtracted, eighth through tenth are the coefficients a, b and d and eleventh and twelfth are the in-phase and quadrature current through the test resistor corrected for both DC and AC leakage. Five sequential frequency points are shown at the beginning, five—in the middle and five—at end of the sweep The frequency response of an ideal resistor measured by an ideal network analyzer is supposed to consist of a frequency-independent in-phase component and a zero quadrature component. (FIG. 5A) shows the raw data and, for illustration, a theoretical response of an ideal resistor with ±10% error bars. It is easy to see that both in phase and quadrature data $S_{Re}$ and $S_{Im}$ deviate from the expected ideal theoretical behavior by many tens of percent, especially at low frequencies. (FIG. 5B) shows the data processed according to equations (3) and, for illustration, the theoretical response of an ideal resistor with ±0.5% error bars, which is the system accuracy value found in the AD5933 datasheet.

It can be seen that after the processing the in-phase component is much larger than the quadrature one and predominantly constant with the frequency at Frequency Code above about 4000, decreasing sharply at lower Frequency Code values. This means that the applied method allows for complete correction of the DFT leakage errors caused by the discontinuous test vector. Below Frequency Code=4000, which corresponds to about 120 Hz at 16 MHz system clock, the inaccuracy of digital implementation of the DFT becomes prevalent. The quadrature component is close to 0, slowly decreasing into negative values with the increasing frequency. This behavior of the quadrature component is the result of the phase delay caused by the low-pass filter at the input of the ADC, shown on the functional block diagram in the datasheet. This can be easily accounted for and further corrected by applying conventional calibration techniques.

After the additive DC leakage and the AC leakage errors have been eliminated from the raw data by this method, the conventional single-frequency-point calibration and multi-point calibration techniques can be applied and will produce accurate results over a much wider frequency range than when applied to raw data directly. The experimental data indicates that at 16 MHz system clock without any additional hardware the proposed method allows the expansion of the usable operational frequency range down to ~100 Hz, enabling a very cost-efficient access to the frequencies two decades below 10 KHz. In the range above 10-20 KHz the DC and AC leakage errors do decrease and for certain low-dynamic range and narrow-frequency applications the AD5933 may deliver adequate results as is, but the proposed method enables a far superior performance at all frequencies, pushing the accuracy to the to the maximum that can be achieved by the device.

It should be noted that the expressions (1) through (3) are agnostic to the Nyquist frequency and allow for correct recovery of undersampled input signals. As it was mentioned earlier, the sampling of the input (and also the test vector) takes place every 4 accumulator increments, so the excitation voltage is digitally synthesized at a sampling rate 4 times higher than the sampling rate of the input and, while the input may be undersampling, the excitation signal still satisfies Nyquist criterion. Notwithstanding the high-frequency input signal suppression by the low pass filter in the AD5933, signals at frequencies up to approximately 950 KHz can be measured and processed using this method, which allows to operate the AD5933 over nearly four-decade frequency range.

Skilled in the art would appreciate that the same methods and systems can be implemented using different hardware, for example ADuCM350 system-on-a-chip or DSP-based and FPGA-based systems for frequency synthesis, signal digitization and processing.

The various examples of the systems and methods around the use of AD5933 device described herein are representative of, and not to be considered limiting of the inventions disclosed and claimed herein.

What is claimed is:

1. A method of improving a signal measurement by a Digital Fourier Transform (DFT) Detector, comprising:
   providing a DFT in combination with a test vector generator to form the DFT detector, wherein the test vector generator supplies discontinuous test vectors to the DFT at a plurality of selected frequencies and having a number of samples;
   calculating in-phase gains, quadrature gains and crosstalk factors based on each of the selected frequencies and the number of samples of the discontinuous test vectors;
   inputting a measurement signal into the DFT detector and receiving output values from the DFT detector wherein the output values include artifacts; and
   removing the artifacts from the output values, by determining a corrected output using the output values, the in-phase gains, the quadrature gains and the crosstalk factors according to expression 3.

2. The method of improving a signal as recited in claim 1, wherein the measurement signal is synchronous with the discontinuous test vectors.

3. The method of improving a signal as recited in claim 1, wherein the calculation of in-phase gains, quadrature gains, and crosstalk factors is based on expression 2.

4. The method of improving a signal as recited in claim 1, wherein the selected frequencies includes all frequencies in the operating range of the DFT detector.

5. The method of improving a signal as recited in claim 1, wherein the method is performed using devices selected from the group consisting of: AD5933, AD5934 and ADuCM350.

* * * * *